United States Patent [19]

Ota et al.

[11] Patent Number: 5,347,356
[45] Date of Patent: Sep. 13, 1994

[54] SUBSTRATE ALIGNING DEVICE USING INTERFERENCE LIGHT GENERATED BY TWO BEAMS IRRADIATING DIFFRACTION GRATING

[75] Inventors: Kazuya Ota, Tokyo; Nobutaka Magome, Kawasaki; Hideo Mizutani, Yokohama; Kouichiro Komatsu, Tokyo, all of Japan

[73] Assignee: Nikon Corporation, Tokyo, Japan

[21] Appl. No.: 982,129

[22] Filed: Nov. 25, 1992

Related U.S. Application Data

[63] Continuation of Ser. No. 671,109, Mar. 18, 1991, abandoned.

[30] Foreign Application Priority Data

Mar. 20, 1990 [JP] Japan .................................... 2-71563

[51] Int. Cl.$^5$ .............................................. G01B 9/02
[52] U.S. Cl. .................................. 356/363; 356/349; 356/356; 356/401
[58] Field of Search ............... 356/349, 356, 363, 400, 356/401

[56] References Cited

U.S. PATENT DOCUMENTS

| | | | |
|---|---|---|---|
| 4,636,077 | 1/1987 | Nomura et al. | 356/363 |
| 4,710,026 | 12/1987 | Magome et al. | 356/349 |
| 5,070,250 | 12/1991 | Komatsu et al. | 356/363 |

FOREIGN PATENT DOCUMENTS 0090006  3/1990  Japan .................................. 356/349

*Primary Examiner*—Samuel A. Turner
*Attorney, Agent, or Firm*—Shapiro and Shapiro

[57] ABSTRACT

An aligning device for aligning a substrate with a predetermined point on the basis of a detection signal from a photoelectric detector uses interference light generated by light diffracted from a diffraction grating. A calculating device calculates at least one of a crossing angle of two coherent beams irradiating the grating and the rotational error of a crossing line between a plane containing principal rays of the beams and the surface of the substrate, with respect to the direction of arrangement of the grating, based on the phase difference between detection signals of the photoelectric detector corresponding to interference light generated from different portions of the crossing area. The output of the calculating device may be used to adjust the crossing angle and/or to correct the rotational error.

19 Claims, 11 Drawing Sheets

FIG. 13
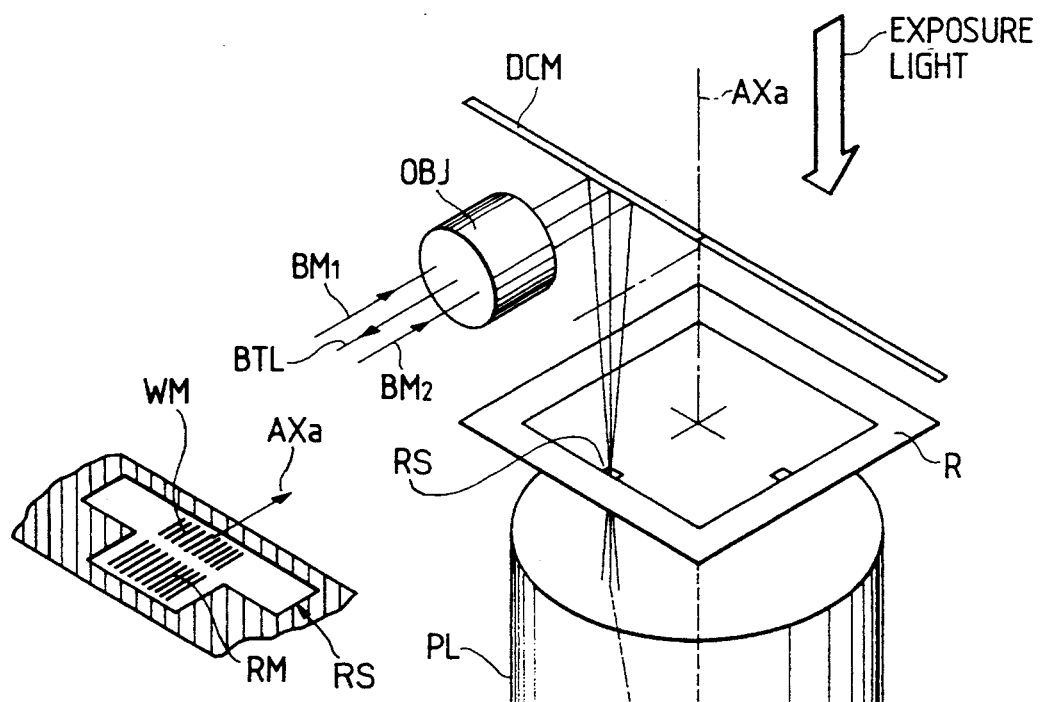
FIG. 13A
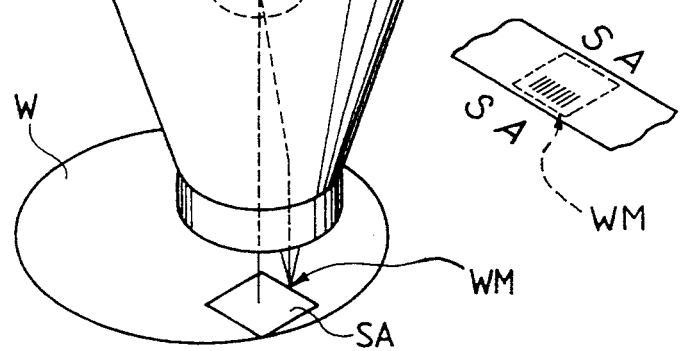
FIG. 13B

SUBSTRATE ALIGNING DEVICE USING INTERFERENCE LIGHT GENERATED BY TWO BEAMS IRRADIATING DIFFRACTION GRATING

This is a continuation of application Ser. No. 671,109 filed Mar. 18, 1991, now abandoned.

BACKGROUND OF THE INVENTION

1. Field of the Invention

The present invention relates to an aligning, device provided with a sensor for detecting the position of a substrate with a resolving power of the order of a nanometer (nm), and more particularly to such aligning device adapted for use in an lo exposure apparatus for semiconductor device manufacture, such as a stepper or an aligner.

2. Related Background Art

In recent photolithographic processes for semiconductor device manufacture, there are widely employed reduction projection exposure apparatus of step-and-repeat type (steppers) for transferring reticle patterns onto a wafer with a high resolving power. With the progress in the level of integration in the semiconductor devices, there have been developed the use of shorter wavelengths in the exposing light and lenses of larger numerical aperture (N.A.) for use in such steppers, and a sub-micron line width (0.5–0.7 $\mu$m) has been recently resolved on the wafer. For transferring such fine pattern, there is required a precision of alignment matching such resolving power, and there has been conceived an improvement in the aligning accuracy for example through an improvement in the detecting resolving power of the alignment system.

Such alignment system of high resolving power, for example disclosed in the U.S. Pat. No. 4,710,026, consists of irradiating a one-dimensional diffraction grating mark formed on a wafer with coherent parallel beams from two directions to form one-dimensional interference fringes on said diffraction grating mark, and photoelectrically detecting the intensity of diffracted light (interference light) generated from said diffraction grating mark by the illumination with said interference fringes.

The disclosed system can be realized in a heterodyne method in which the parallel beams from two directions are given a predetermined frequency difference, or a homodyne method in which said beams have no difference in frequency. In said homodyne method, stationary interference fringes are formed parallel to the diffraction grating mark. For position detection, the diffraction grating mark (object) has to be moved slightly in the direction of pitch, and the mark position is determined with reference to the interference fringes. On the other hand, in the heterodyne method, the interference fringes move rapidly with the beat frequency in the direction of pitch, so that the mark position cannot be determined with reference to the interference fringes but can only be determined with reference to a time factor (phase difference) related to the high-speed movement of the interference fringes.

More specifically, the heterodyne method is to detect a positional aberration within $\pm P/4$, wherein P is the pitch of grating, by determining the phase difference (within $\pm 180°$) between a photoelectric signal (optical beat signal) obtained by intensity modulation of the interference light from the diffraction grating mark of the wafer with the beat frequency of the frequency difference and an optical beat signal of reference interference light separately prepared from two light beams. If the grating pitch P is 2 $\mu$m (line and space of 1 $\mu$m) and the resolving power for the phase difference measurement is of the order of 0.5°, the resolving power for the measurement of positional aberration is $(P/4)\cdot(0.5/180)\cong 0.0014$ $\mu$m. As such method can detect the mark position with an extremely high resolving power, it is expected to achieve an alignment accuracy higher by more than one order than the conventional method for mark position detection.

However, such alignment system may result in a loss of alignment accuracy and become unable to fully exhibit the advantage of high resolving power unless the crossing angle of two laser beams is exactly adjusted so as to satisfy a relation $P = m \cdot P'$ (m=1, 2, ...) between the grating pitch P and the pitch P' of the interference fringes, and the interference fringes and the grating are made mutually exactly parallel so that the rotational error of a crossing line between a plane containing principal rays of two laser beams and the wafer surface with respect to the direction of arrangement of grating is substantially zero. In conventional practice, therefore, the pitch P' of the interference fringes is exactly set with respect to the grating pitch P so as to satisfy the above-mentioned relation by photoelectrically detecting the interference light from the grating mark while varying the crossing angle of two laser beams, and regulating said crossing angle so as to maximize the intensity of said interference light. On the other hand, the rotational error of the crossing line between the plane containing the principal rays of two laser beams and the wafer surface is substantially brought to zero, by photoelectrically detecting the interference light from the diffraction grating mark and mutually rotating the diffraction grating mark (wafer) and the interference fringes so as to maximize the intensity of the interference light.

However, in such conventional technology, the crossing angle of two laser beams and the rotational error are measured and regulated by the detection of maximum value of the diffracted light intensity (namely voltage of the optical beat signal), namely by the peak shooting method. Such peak shooting method is associated with an essential drawback that the rate (sensitivity) of signal variation is zero at the maximum value. Also the calculation of the crossing angle or the rotational error by monitoring of electric levels is apt to be influenced by noises, and is unable to provide satisfactory accuracy of measurement.

SUMMARY OF THE INVENTION

In consideration of the foregoing, an object of the present invention is to provide an aligning device allowing measurement and adjustment of the crossing angle (pitch of interference fringes) of two alignment laser beams and of the relative rotational error with a high precision and with a high speed.

The above-mentioned object can be attained, according to the present invention by a device provided with a beam generating device for generating two coherent beams $LB_{1p}$, $LB_{2p}$ for irradiating a diffraction grating formed on a wafer W from two directions with a crossing angle $\theta$, an objective lens (29) for passing said two beams $LB_{1p}$, $LB_{2p}$ with a predetermined distance on a pupil plane Ep thereby directing said beams with a predetermined crossing angle $\theta$ to the wafer W, and a photoelectric detector (31) for receiving interference light BTL of diffracted light generated in the same direction from the diffraction grating, through said objective lens (29), for aligning the diffraction grating to a predetermined position based on an optical beat signal released from the photoelectric detector 31, comprising:

a reference member (33) bearing predetermined reference marks (diffraction grating marks 33a, 33b);

a correction device (parallel faced flat glass plates 12a, 12b) capable of regulating at least one of the crossing angle $\theta$ of two beams $LB_{1p}$, $LB_{2p}$, and the rotational error $\omega$ of the crossing line (37) between a plane (38) containing the principal rays of said two beams and the wafer surface, with respect to the direction of arrangement of gratings of the reference marks; and a calculating device (main controller MCS) for calculating at least one of the crossing angle $\theta$ (pitch P' of interference fringes) and the rotational error $\omega$, based on the phase difference between the light beat signals released from the photoelectric detector (31) respectively corresponding to interference light generated from a first portion of an illumination area LA where the two beams $LB_{1p}$, $LB_{2p}$ mutually cross on the reference marks and an interference light generated from a second portion of said illumination area LA.

Also a field diaphragm (25) for varying the illumination area LA by the two beams $LB_{1p}$, $LB_{2p}$ is provided at a position substantially conjugate with the reference mark with respect to the objective lens (29) or in the vicinity of said position, and, at the detection of the interference light BTL generated from the first and second portions of the illumination area LA, said area LA is enlarged, relative to the reference mark, either in the direction of arrangement of gratings or in a direction substantially perpendicular thereto, by means of said field diaphragm (25).

According to the present invention, the crossing angle of two laser beams and the rotational error are calculated from the phase difference of photoelectric signals (optical beat signals) corresponding to the intensities of diffracted light from the diffraction grating formed on the substrate, without the search of signal level with the peak shooting method, so that loss in the precision of measurement resulting for example from electric noise can be prevented. Since the illumination area of two laser beams (area of interference fringes) and the diffraction grating are mutually moved by a stage in the above-mentioned operation, said precision of measurement is governed by the precisions of positioning and position measurement of said stage and of the phase detection of the optical beat signals. Thus an improvement in the precision of measurement can be expected through the improvements in these precisions. The precision of measurement can be further improved by rendering variable the size of the illumination area of two laser beams, and widening the illumination area relative to the diffraction grating at said measurement compared to the alignment operation, namely increasing the amount of relative movement of said interference fringes and the diffraction grating.

BRIEF DESCRIPTION OF THE DRAWINGS

FIGS. 13, 13A and 13B are a schematic perspective view of an exposure apparatus equipped with an alignment system of TTR method of the present invention;

DESCRIPTION OF THE PREFERRED EMBODIMENTS

Figure 1:
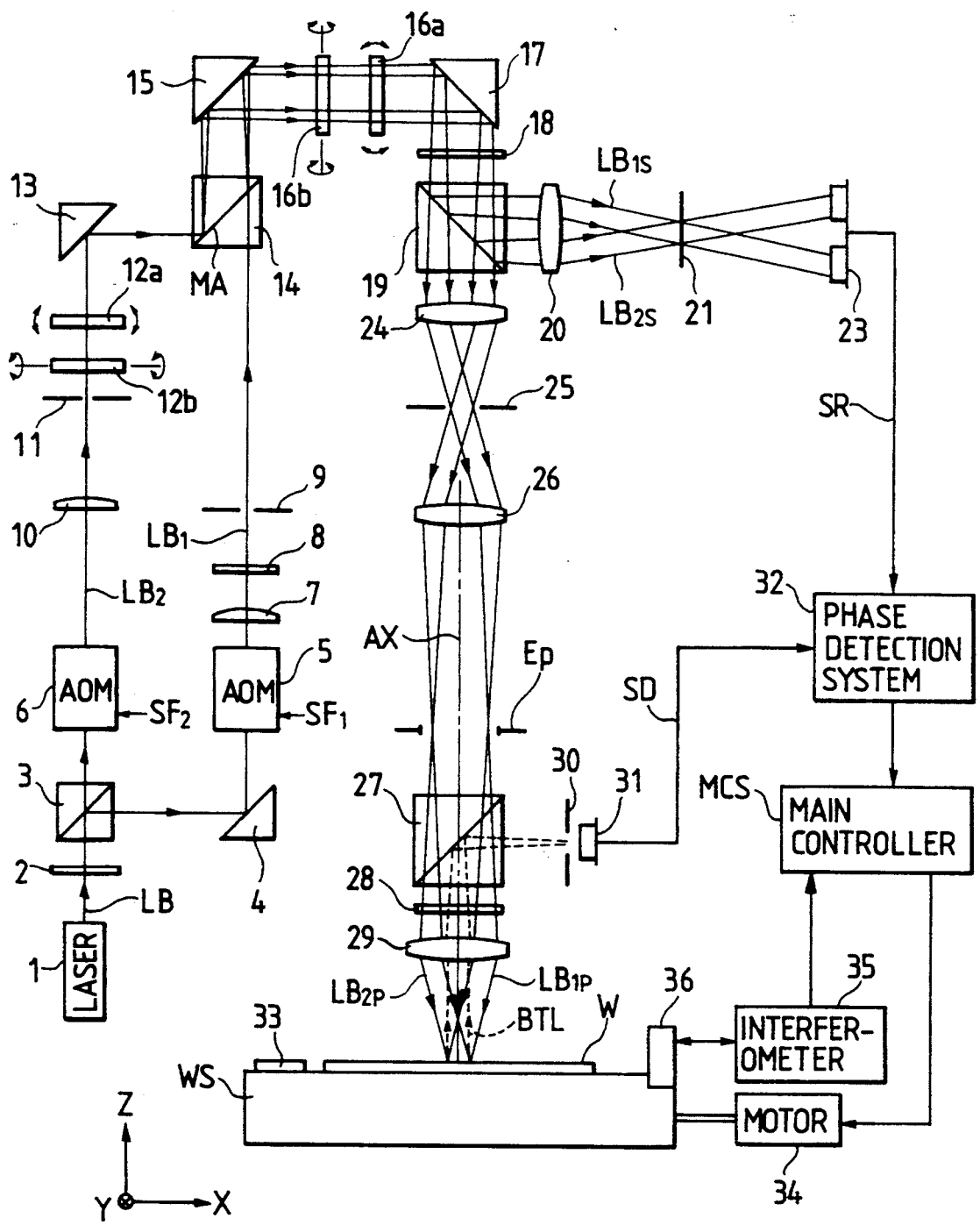
FIG. 1 is a schematic plan view of an aligning device embodying the present invention.

FIG. 1 is a schematic plan view of an aligning device constituting a first embodiment of the present invention, particularly adapted for use as a wafer alignment system of off-axis type to be fixed outside the projection lens of a stepper. As shown in FIG. 1, a laser unit 1 emits a linearly polarized (for example P-polarized) alignment illuminating light (laser beam) LB of a predetermined wavelength (with a frequency f). Said laser beam LB is subjected to a rotation of polarizing plane by ca. 45° in a ¼ wavelength plate 2, then guided to a polarizing beam splitter (PBS) 3 and split into a P-polarized beam and an S-polarized beam of substantially equal intensities. The laser unit 1 preferably has a wavelength practically non-actinic to a photoresist layer to be formed on the wafer, for example a He-Ne laser unit with a wavelength of 633 nm.

The S-polarized beam reflected by the polarizing beam splitter 3 enters, through a mirror 4, a first acoustooptical modulator 5 (hereinafter written as AOM5) serving as a frequency shifter, while the P-polarized beam transmitted by the polarizing beam splitter 3 enters a second acoustooptical modulator (hereinafter written as AOM6). The AOM5 is driven with a high-frequency signal SF1 of a frequency f1 and emits a first-order light beam LB1 deflected by a diffraction angle determined by said frequency f1. The AOM6 is driven by a high-frequency signal SF2 of a frequency f2 of a difference $\Delta f$ from said frequency f1 (f2=f1−$\Delta f$) and emits a first-order light beam LB2 deflected by a diffraction angle determined by said frequency f2.

The beams emerging from the AOM's 5, 6 are intercepted, except for the +1st-order lights, by suitably positioned slits 9, 11. The driving frequencies f1, f2 and the frequency difference $\Delta f$ preferably satisfy relationships f1>>$\Delta f$, f2>>$\Delta f$, and the upper limit of $\Delta f$ is suitably determined according to the response characteristics of photoelectric detectors 23, 31. In the present embodiment the driving frequencies f1, f2 of the AOM's 5, 6 are for example respectively selected as 80.000 MHz and 79.975 MHz with a frequency difference $\Delta f$ as low as 35 KHz, so that the 1st-order diffracted lights in the AOM's 5, 6 has the same diffraction angle. The frequency shifters for the P- and S-polarized beams may also be composed of optical wave guides instead of the AOM's.

Between the AOM 5 and the slit 9 there are provided a lens 7 and a ½ wavelength plate 8, so that the S-polarized beam LB1 emerging from the AOM5 after modulation with a frequency f1 is converted into a P-polarized beam by said ½ wavelength plate 8, and enters a half beam splitter (HBS) 14 positioned at a pupil plane of the alignment system or in the vicinity thereof. On the other hand, the P-polarized beam LB2 emerging from the AOM6 after modulation with a frequency f2 passes through a lens 10 and parallel-faced flat glass plates 12a, 12b inclined by an arbitrarily regulable angle to the advancing direction of the beam LB2, then reflected by a mirror 13 and enter the HBS 14.

A small shift of the beam LB2 caused by an inclination of the parallel-faced flat glass plate 12a moves the spot of said beam $LB_{2p}$ in the direction of arrangement of grating of a wafer mark WM (X-direction in the present embodiment) on the pupil plane Ep (beam waist position) of the alignment system to be explained later, whereby the distance of the spots of the beams $LB_{1p}$, $LB_{2p}$ or the crossing angle $\theta$ thereof can be regulated. On the other hand, an inclination of the parallel-faced flat glass plate 12b moves the spot of the beam LB2 in a direction substantially perpendicular to said direction of arrangement of grating, namely in the Y-direction, on said pupil plane Ep, whereby a plane containing the principal rays of the beams $LB_{1p}$, $LB_{2p}$ can be rotated about the Z-axis. Also said flat glass plates 12a, 12b may be replaced by a parallel-faced flat glass plate that can be inclined two-dimensionally with respect to the advancing direction of the beam LB2, in order to achieve similar regulation of the spot positions on the pupil plane Ep.

The half beam splitter 14 has a totally reflecting mirror MA on a half of the junction plane thereof, so that the beam LB2 entering said mirror is almost totally reflected, while the beam LB1 entering the transparent part of the junction is transmitted thereby. The half beam splitter 14 does not coaxially synthesize the beams LB1, LB2 but guides said beams in parallel manner with a predetermined distance therebetween. Thus the two beams LB1, LB2 have mutually parallel principal rays and are positioned symmetrically with respect to the axis AX of the alignment system.

The two P-polarized beams LB1 (frequency ft f1) and LB2 (frequency ft f2) emerging from the half beam splitter 14 with mutually parallel principal rays are reflected by a mirror 15, then pass through parallel-faced flat glass plates 16a, 16b positioned in a pupil space of the alignment system inclinably to the optical axis AX, further reflected by a mirror 17, subjected to a rotation of the polarizing plane by about 45° in a ½ wavelength plate 18, and reach a polarizing beam splitter 19. The beam LB1 is split therein into a P-polarized beam $LB_{1p}$ and an S-polarized beam $LB_{1s}$ of a frequency ft f1, while the beam LB2 is split into a P-polarized beam $LB_{2p}$ and an S-polarized beam $LB_{2s}$ of a frequency ft f2. An inclination of the glass plate 16a and/or 16b moves the spots of the beams $LB_{1p}$, $LB_{2p}$ one- or two-dimensionally on the pupil plane of the alignment system with a constant distance between the spots, whereby the inclination of the axis of symmetry of the beams $LB_{1p}$, $LB_{2p}$ with respect to the axis AX of the alignment system can be regulated.

Two S-polarized beams $LB_{1s}$ (frequency ft f1) and $LB_{2s}$ (frequency ft f2) reflected by the polarizing beam splitter 19 are transmitted by a lens system 20 for converting the Pupil into an image plane (inverse Fourier conversion lens), and enter a reference diffraction grating 21 fixed on the apparatus, in the form of parallel-ray beams from two different directions with a predetermined crossing angle $\theta$. The photoelectric detector 23 has two divided photosensor elements which independently receive (photoelectrically convert) the interference light resulting from the 0-th order light of the beam $LB_{1s}$ transmitted by the reference diffraction grating 21 and the +1st-order diffraction light of the beam $LB_{2s}$ proceeding in parallel direction, and the interference light resulting from the −1st order diffracted light of the beam $LB_{1s}$ and the 0-th order light of the beam $LB_{2s}$ proceeding in parallel direction. The sinusoidal photoelectric signals corresponding to the intensities of these two interference light beams are added by amplifier (not shown) to obtain a photoelectric signal SR which constitutes an optical beat signal of a frequency proportional to the frequency difference $\Delta f$ of the beams $LB_{1s}$, $LB_{2s}$. The grating pitch of the reference diffraction grating 21 is selected equal to the pitch P' of the interference fringes of the beams $LB_{1s}$, $LB_{2s}$. Said photoelectric detector 23 may be so constructed as to receive said two interference light beams on the same light-receiving face and to generate a photoelectric signal corresponding to the intensity of the interference lights added on said light-receiving face. Such structure allows shortening the distance between the interference diffraction grating 21 and the photoelectric detector 23.

Figure 2:
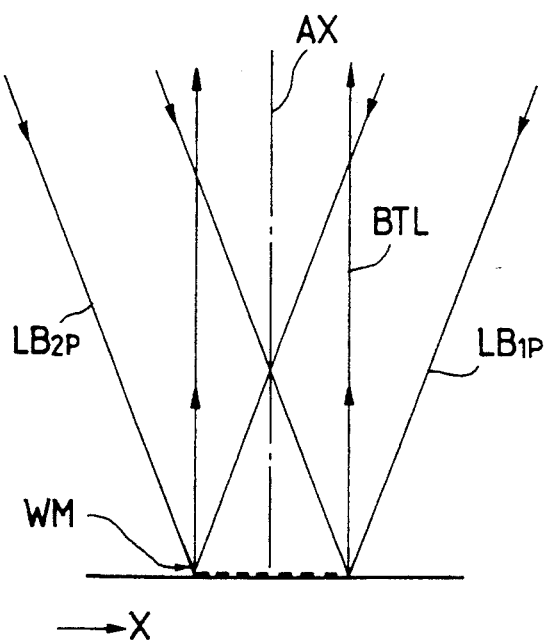
FIG. 2 is a schematic view showing two beams irradiating a grating mark formed on a substrate.

On the other hand, two P-polarized beams $LB_{1p}$ (frequency ft f1) and $LB_{2p}$ (frequency ft f2) transmitted by the polarizing beam splitter 19 are converted into parallel-ray beams inclined by a predetermined angle by a lens 24, then mutually cross at a field diaphragm 25 positioned conjugate with the wafer W, and enter a lens 26. Said beams $LB_{1p}$, $LB_{2p}$ are transmitted by a polarizing beam splitter 27, then converted into circularly polarized light by a ¼ wavelength plate 28, and enter a telecentric objective lens 29 for alignment. Said beams $LB_{1p}$, $LB_{2p}$ are focused as spots on the pupil plane Ep of said objective lens 29 or in the vicinity thereof, said spots being substantially symmetrical with respect to the center (optical axis AX) of the pupil. The beams $LB_{1p}$, $LB_{2p}$ (circularly polarized) emerging from the objective lens 29 constitute parallel-ray beams which, as shown in FIG. 2, are inclined symmetrically about the optical axis AX in the direction of arrangement of grating (X-direction) of the wafer mark WM, and enter the wafer mark WM from two different directions with a crossing angle $\theta$, mutually crossing thereon.

In the present embodiment the field diaphragm 25 has a rectangular aperture of a fixed size, but is preferably provided with a rhombic or parallelogrammic aperture with edges inclined to the interference fringes formed by the beams $LB_{1p}$, $LB_{2p}$. Also the crossing angle $\theta$ of said beams on the wafer does not exceed, at maximum, the numerical aperture (N.A.) at the exit side of the objective lens 29. Furthermore, the direction of a line connecting the spots of the beams $LB_{1p}$, $LB_{2p}$ formed on the pupil plane Ep substantially point symmetrically with respect to the axis AX substantially coincides with the direction of arrangement of grating (X-direction) of the wafer mark WM.

The wafer W is placed on a wafer stage WS, and is rendered movable two-dimensionally in the X- and Y-directions by step-and-repeat method with a motor 34. The position of said wafer stage WS is constantly detected, for example with a resolving power of 0.01 μm, by a laser interferometer 35. On an end of the wafer stage WS, there is fixed a movable flat mirror 36 for reflecting the laser beam from the laser interferometer 35. Also on the wafer stage WS, there is provided a reference member (glass substrate) 33 having a fiducial mark, formed as a diffraction grating to be used for regulating the crossing angle $\theta$ (pitch P' of the interference fringes) of the beams $LB_{1p}$, $LB_{2p}$ and the rotational error $\omega$, in such a manner that said mark substantially coincides with the surface position of the wafer W. Said reference member 33 is provided, as fiducial marks, with diffraction grating marks 33a, 33b (duty ratio 1:1) formed by surface irregularities of reflective chromium layer.

Figure 3A:
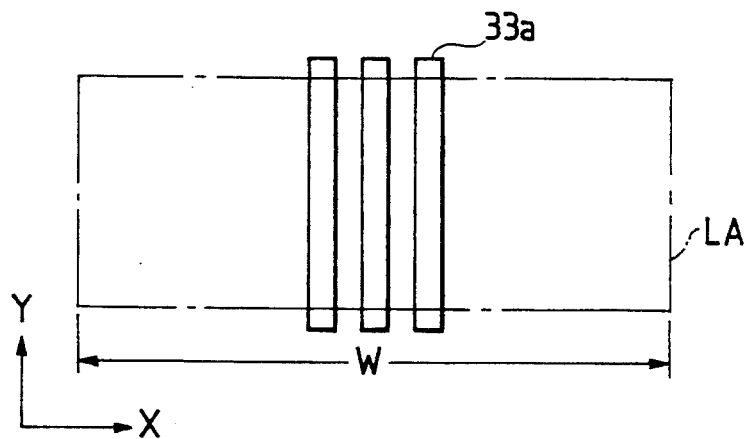
FIGS. 3A and 3B are schematic views showing examples of a diffraction grating mark (reference mark formed on a reference member.
Figure 3B:
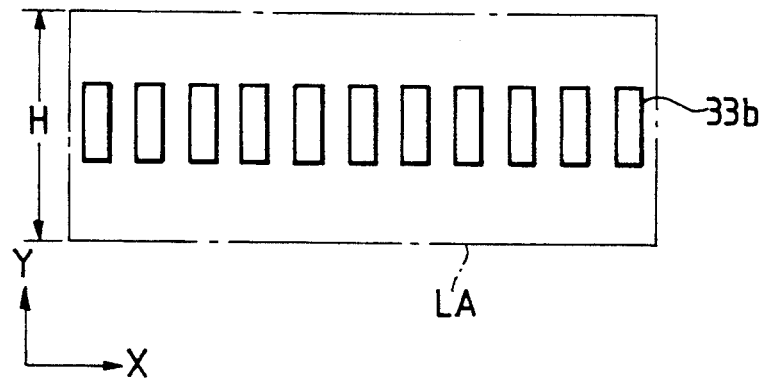

FIGS. 3A and 3B schematically show the structure of said diffraction grating marks 33a, 33b, each composed of plural bar patterns extending in the Y-direction and arranged in the X-direction for example with a pitch of 8 μm. The diffraction grating mark 33a, used for regulating the crossing angle $\theta$ of two laser beams $LB_{1p}$, $LB_{2p}$, is so formed, as shown in FIG. 3A, that the dimension in the measuring direction (X-direction) or the direction of arrangement of the grating is shorter than that of the illumination area (area of formation of interference fringes) LA Of said beams, namely formed with a small number of bar patterns. In fact said mark is identical, in pitch and dimension, with the wafer mark WM used in the actual exposure process, except that said grating mark is composed of three bar patterns only. On the other hand, the diffraction grating mark 33b, used for correcting the rotational error $\omega$ of said two beams $LB_{1p}$, $LB_{2p}$, is so formed, as shown in FIG. 3B, that the dimension in the Y-direction is shorter than that of the illumination area LA having a length H in the Y-direction. Said mark 33b is identical in pitch, dimension and number of bar patterns, with said wafer mark WM, except that the bar patterns are shorter in the non-measuring direction (Y-direction).

The beams $LB_{1p}$, $LB_{2p}$ entering the wafer mark WM with the predetermined crossing angle $\theta$ (FIG. 2) form one-dimensional fringes of a pitch P' of 1/m (m being an integer) of the grating pitch P (P'=P/2 in the present embodiment), on an arbitrary plane perpendicular to the optical axis AX in a space where said beams mutually cross, for example on the wafer surface. Said interference fringes flow in the X-direction, with a velocity V=$\Delta$f·P' corresponding to the frequency difference $\Delta$f of said beams.

Thus, in response to the irradiation with the circularly polarized beams $LB_{1p}$, $LB_{2p}$, the mark WM generates ±1st-order diffracted (interference) light BTL proceeding along the optical axis AX and having beat waves repeating light and dark changes according to the movement of the interference fringes. Said interference light BTL proceeds again through the objective lens 29 and along the optical axis AX, then is converted into an S-polarized light by the ¼ wavelength plate 28, is reflected by the polarizing beam splitter 27, and is received by a photoelectric detector 31 through a spatial filter 30 positioned on the pupil plane Ep of the objective lens 29 (or a relayed conjugate plane thereof). The photoelectric detector 31 generates a photoelectric signal SD corresponding to the intensity of the interference light BTL and composed of a sinusoidal AC signal corresponding to the cycles of light-dark changes of the interference fringes (hereinafter called optical beat signal). Said signal SD is supplied to a phase detecting system 32.

Figure 4:
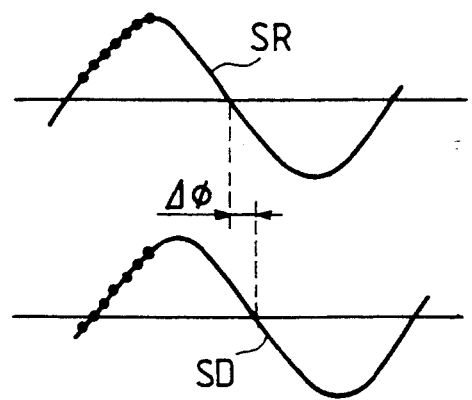
FIG. 4 is a chart showing photoelectric signals (optical beat signals) obtained from the photoelectric detector, respectively corresponding to the intensities of interference light from a reference grating mark and a diffraction grating mark on the substrate.

The phase detecting system 32 receives the optical beat signal SD from the photoelectric detector 31 and the optical beat signal SR supplied as a reference signal from the photoelectric detector 23, and determines the phase difference $\Delta\phi$ thereof with respect to the signal SR, as shown in FIG. 4. Said phase difference $\Delta\phi$ (within +180°) corresponds to the positional aberration of the wafer mark WM within ±P/4, and said positional aberration $\Delta$X (or $\Delta$Y) is calculated according to the following equation:

$$\Delta X = \frac{P}{2} \cdot \frac{\Delta\phi}{2\pi}. \qquad (1)$$

If the pitch P of the wafer mark WM is 8 μm, and the phase detecting system 32 has a resolving Power of 0.2° the resolving Power for positional aberration becomes as small as 0.0022 μm. The practical resolution, however, is about 0.01 μm (0.9° in phase) because of the influence of noise etc. This detection method is so-called heterodyne method, which allows detecting the positional aberration with respect to the reference diffraction grating, with a high resolving power even in a stationary state, if the position setting error of the wafer is within ±P/4.

The main controller MCS effects servo control on the motor 34, based on the phase difference information (positional aberration) from the phase detecting system 32 and the positional information from the laser interferometer 35, thereby placing the wafer W in a predetermined position, also calculates the crossing angle $\theta$ (pitch P' of interference fringes) of the beams $LB_{1p}$, $LB_{2p}$ and the rotational error $\omega$ thereof from the phase difference information, and sends drive commands to the parallel-faced flat glass plates 12, 16 based on the results of said calculations.

Figure 5A:
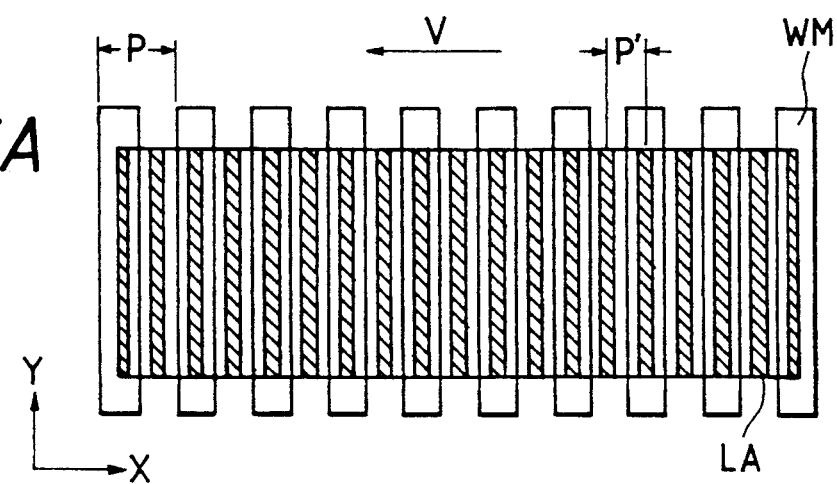
FIGS. 5A, 5B, 6A and 6B are views for explaining the operation for measuring the crossing angle (pitch of interference fringes) of two beams on the substrate.

In the following there will be explained the function of the present embodiment. At first there will be described the measurement and regulation of the crossing angle $\theta$, or the pitch P' of the interference fringes, of two beams $LB_{1p}$, $LB_{2p}$. Said beams form, on the wafer mark WM, interference fringes as shown in FIG. 5A (hatched portions indicate dark fringes), which flow in the X-direction with a velocity V corresponding to the frequency difference $\Delta$f of said beams, with respect to the mark WM. If the crossing angle $\theta$ of said beams and the grating pitch P satisfy the following relation:

$$\sin\frac{\theta}{2} = \frac{\lambda}{P} \qquad (2)$$

wherein $\lambda$ is the wavelength of said beams, the grating mark generates ±1st-order diffracted light in the same direction, and the pitch P' of the interference fringes becomes exactly half of the grating pitch P (FIG. 5A).

Figure 5B:
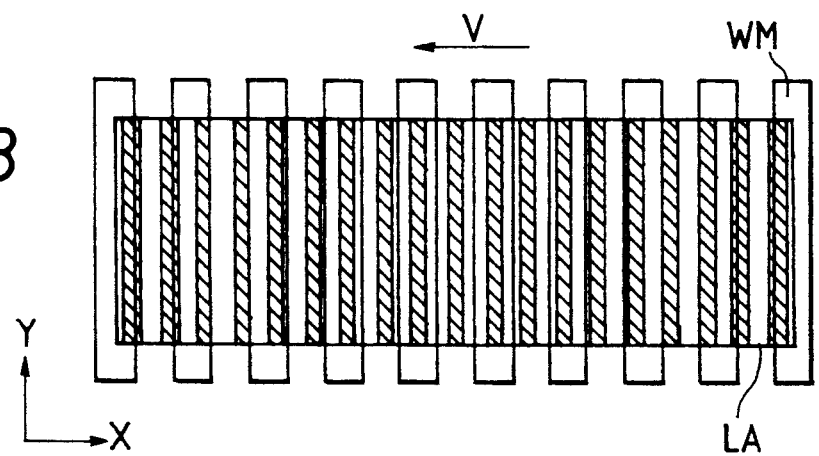

However, if said crossing angle $\theta$ does not satisfy the relation (2), the pitch P' is no longer equal to P/2, as shown in FIG. 5B, so that the ±1st-order diffracted light is are generated in different directions and the precision of measurement of positional aberration may deteriorate.

Figure 6A:
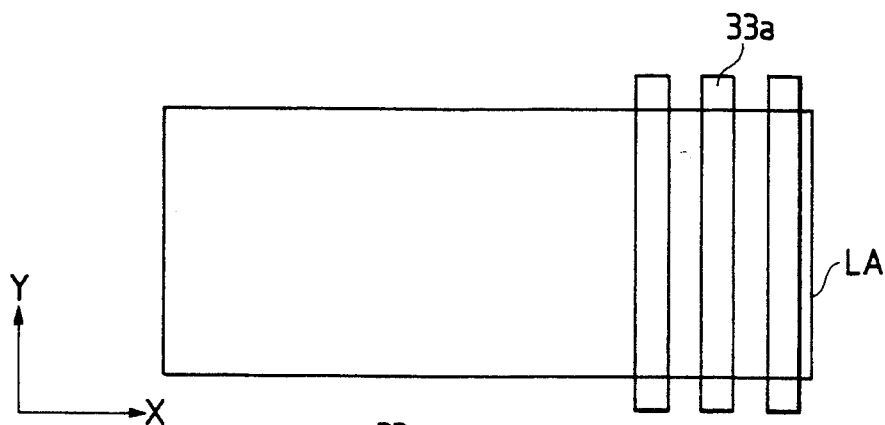
Figure 6B:
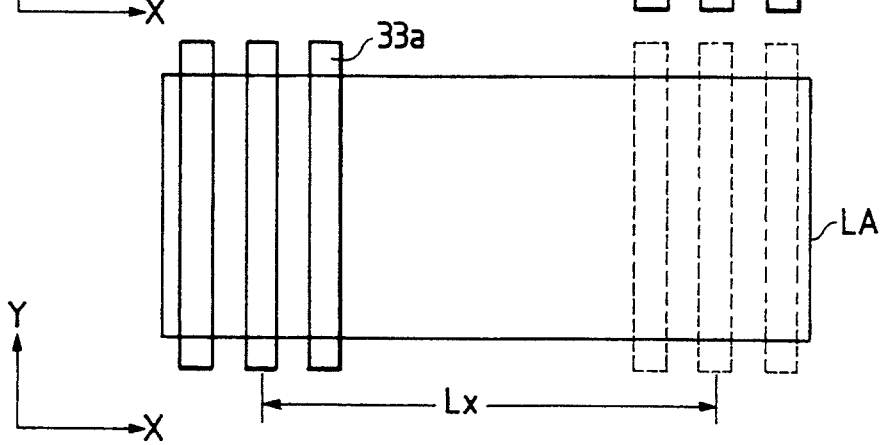

The main controller MCS drives the wafer stage WS by the motor 34, thereby moving the reference member 33 or the diffraction grating mark 33a to the irradiating position of the beams $LB_{1p}$, $LB_{2p}$ and setting it at the right-hand end of the illumination area LA (FIG. 6A). Thereafter the mark 33a is irradiated by said beams, and the photoelectric detector 31 receives the interference light BTL from said mark 33a and sends the optical beat signal to the phase detecting system 32. Thus said system 32 determines and stores the phase difference $\phi 1$ with respect to the reference beat signal SR. Then the wafer stage WS is driven to move the grating mark 33a by Lx (<W) in the X-direction within the illumination area LA (FIG. 6B), and an optical beat signal of the interference light from the mark 33a is similarly sent to the phase detecting system 32, which determines the phase difference $\phi 2$ with respect to the reference beat signal SR. Said moving distance Lx can be represented as Lx=n·P/2=n·P' wherein n is a natural number. If the pitch P' of the interference fringes is exactly half of the grating pitch P, the relative phase difference ($\phi 2 - \phi 1$) between the optical beat signals obtained in the above-mentioned two states becomes equal to zero. However, since P' ≠ P/2 in practice, the phase detecting system 32 determines said phase difference ($\phi 2 - \phi 1$) and sends it to the main controller MCS. Said phase detecting system 32 may determine said phase difference by direct comparison of the optical beat signals obtained in said two states, without employing the reference beat signal SR. The main controller MCS calculates the pitch P' of the interference fringes from the following equation, based on the phase difference and the distance Lx:

$$P' = \frac{P}{2} - \frac{P}{4\pi} \cdot (\phi 2 - \phi 1) \cdot \frac{1}{n}. \quad (3)$$

Then, based on the pitch P' determined from the equation (3), the main controller MCS calculates the inclination angle of the glass plate 12a, and the inclination angle of the glass plate 16a for correcting the inclination of the beams $LB_{1p}$, $LB_{2p}$. Thereafter the glass plate 12a is driven to move the spot of the beam $LB_{2p}$ in the X-direction on the pupil plane Ep, thereby regulating the distance of the spots of the beams $LB_{1p}$, $LB_{2p}$. Then the glass plate 16a is driven to move said spots in the X-direction, with a constant distance therebetween, in such a manner that said spots become substantially symmetrical with respect to the center of pupil (optical axis AX), thereby correcting the inclination of the symmetrical axis of the beams $LB_{1p}$, $LB_{2p}$ with respect to the optical axis AX. As a result, the regulation of the crossing angle $\theta$ of said beams is completed, so that said beams are not inclined at the exit side of the objective lens 29, and the pitch P' of the interference fringes is exactly set at a half of the grating pitch P.

The reproducibility $\sigma_p$ of measurement of the above-mentioned pitch P' is uniquely determined by the reproducibility $\sigma_\phi$ of measurement of the optical beat signal (phase $\phi$), as represented by:

$$\sigma_p = \frac{P}{4\pi} \cdot \sqrt{2} \; \sigma_\phi \cdot \frac{1}{n}. \quad (4)$$

The measuring reproducibility $\sigma_\phi$ is governed by the positioning precision of the wafer stage WS, the precision of positional measurement thereof, the precision of phase detection of the optical beat signal etc., among which the precision of stage position measurement with the laser interferometer 35 has the largest influence. Said precision is most significantly affected by air vibration. However, since said air vibration is random, the value $\sigma_\phi$ of said reproducibility can be reduced to $1/\sqrt{N}$ with an increase in the number N of measurements. Consequently the reproducibility $\sigma_p$ of the measurement of the pitch P' of the interference fringes can be obtained with a required precision, by determining the number N of measurements in consideration of the throughput etc.

Also in the present embodiment, said pitch P' of the interference fringes is determined from the equation (3), by moving the grating mark 33a in the X-direction by Lx within the illumination area LA of the beams $LB_{1p}$, $LB_{2p}$ and detecting the optical beat signal (phase $\phi$) at two points in said area LA. Consequently an improved precision can be obtained in the measurement of the pitch P' of the interference fringes, by selecting n in said equation (3), or the moving distance Lx, as large as possible. However, unless the wave front of the beams $LB_{1p}$, $LB_{2p}$ within the illumination area LA is flat, the pitch P' becomes uneven in said area LA, so that a desired precision of measurement cannot be obtained with the above-mentioned measurements at two points. In such case, therefore, it is desirable to move the grating mark 33a in the X-direction for example by (P/2) within the illumination area LA, to detect the phase of the optical beat signal at each position in a similar manner as explained before, and to average the measured values thereby defining the pitch P'. In the present embodiment the number n is taken as a natural number, but it may naturally be selected as an arbitrary value.

Figure 8A:
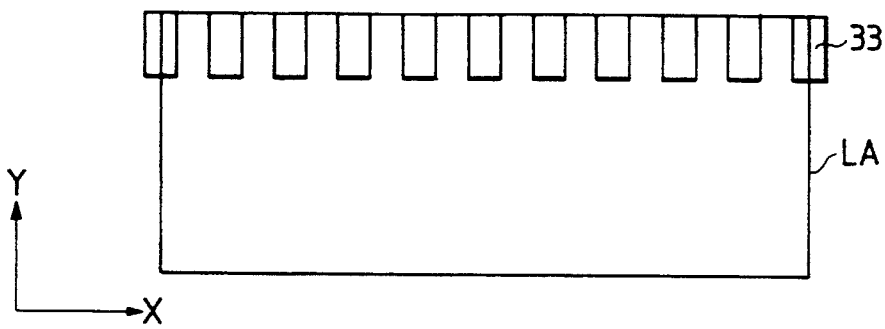
FIGS. 7A, 7B, 8A and 8B are views for explaining the operation for measuring the rotational error of the crossing line between a plane containing the principal rays of two beams and the substrate surface, with respect to the direction of arrangement of grating mark.
Figure 8B:
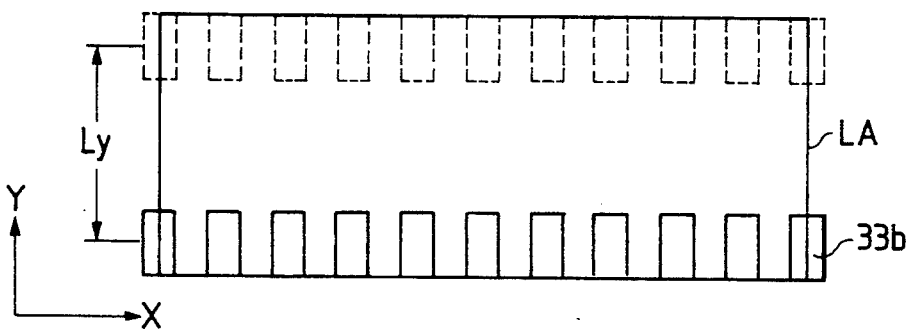
Figure 7A:
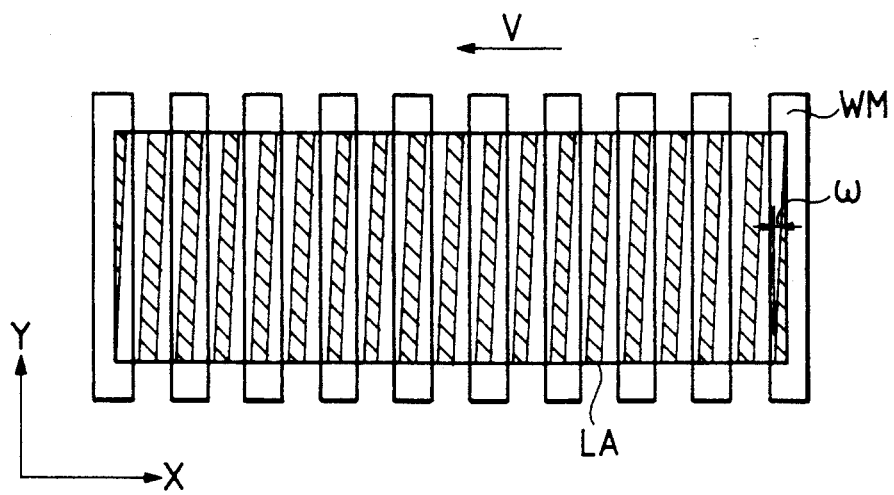
Figure 7B:
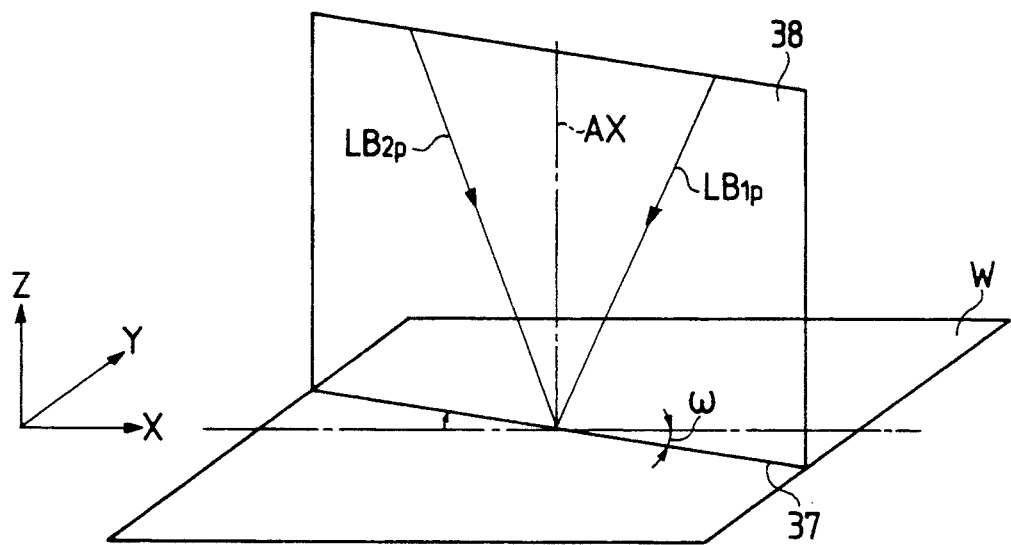

In the following there will be explained the regulation of rotational error $\omega$ of the beams $LB_{1p}$, $LB_{2p}$ with reference to FIGS. 7A, 7B, 8A and 8B. If, as shown in FIG. 7B, the crossing line 37 between a plane 38 containing the principal rays of the beams $LB_{1p}$, $LB_{2p}$ and the wafer surface has an angular error $\omega$ with respect to the direction of arrangement of the grating (X-direction), the interference fringes generated by said beams become rotated with respect to the wafer mark WM (orthogonal X-Y coordinate system) as shown in FIG. 7A, whereby the precision of measurement of positional aberration may deteriorated. The main controller MCS drives the wafer stage WS by the motor 34, thereby moving the diffraction grating mark 33b to the upper end of the illumination LA area of the beams $LB_{1p}$, $LB_{2p}$ (FIG. 8A). Subsequently said grating mark 33b is illuminated by said beams, and the photoelectric detector 31 receives the interference light BTL from the mark 33b and sends an optical beat signal to the phase detecting system 32, which determines and stores the phase difference $\phi 3$ with respect to the reference beat signal SR. Then the wafer stage WS is driven again to move the grating mark 33b in the Y-direction by Ly (<H) within the illumination area LA (FIG. 8B), and an optical beat signal of the interference light BTL is similarly sent to the phase detecting system 32. The system 32 determines the phase difference $\phi 4$ with respect to the beat signal SR, and sends the relative phase difference ($\phi 4 - \phi 3$) between the optical beat signals at two positions, to the main controller MCS, which calculates the rotational error $\omega$ from the following equation, based on said phase difference and the distance Ly:

$$\omega = \frac{P}{4\pi} \cdot (\phi 4 - \phi 3) \cdot \frac{1}{y} . \quad (5)$$

Then, based on the rotational error $\omega$ determined by the equation (5), the main controller MCS calculates the inclination angle of the glass plate 12b, and the inclination angle of the glass plate 16b for correcting the inclination of the symmetrical axis of the beams $LB_{1p}$, $LB_{2p}$. Subsequently the glass plate 12b is driven to move the spot of the beam $LB_{2p}$ in the Y-direction on the pupil plane Ep, and the glass plate 16b is also driven to move the spots of the beams $LB_{1p}$, $LB_{2p}$ in the Y-direction, with a constant distance therebetween, in such a manner that said spots become substantially symmetrical with respect to the center of the pupil. As a result, the rotational regulation of said beams is completed, whereby the rotational error $\omega$ of said beams is maintained substantially zero, without the inclination of the symmetrical axis of said beams at the exit side of the objective lens 29.

In the correction of the rotational error $\omega$, a simultaneous movement of the parallel-faced flat glass plates 12a, 12b allows moving the spot of the beam $LB_{2p}$ on the pupil plane Ep with a constant distance between the spots of the beams $LB_{1p}$, $LB_{2p}$, thereby preventing a change in the crossing angle $\theta$ at the rotational regulation. Similarly a simultaneous movement of the glass plates 16a, 16b enables more precise correction of the inclination of the symmetrical axis of said two beams.

Also in the measurement of the rotational error $\omega$, a required precision can be obtained by determining the number N of measurement in consideration of the throughput etc., as in the measurement of the pitch P' of the interference fringes explained before. Furthermore, as will be apparent from the equation (5), the precision of measurement of the rotational error $\omega$ is increased by selecting the moving distance Ly as long as possible within the illumination area LA. If the wave fronts of the beams $LB_{1p}$, $LB_{2p}$ are anticipated unflat in the illumination area LA, it is desirable to move the diffraction grating mark 33b in the Y-direction by a predetermined amount within said illumination area LA, to detect the phase of the optical beat signal in a similar manner that explained above, and to average the obtained values.

Figure 9A:
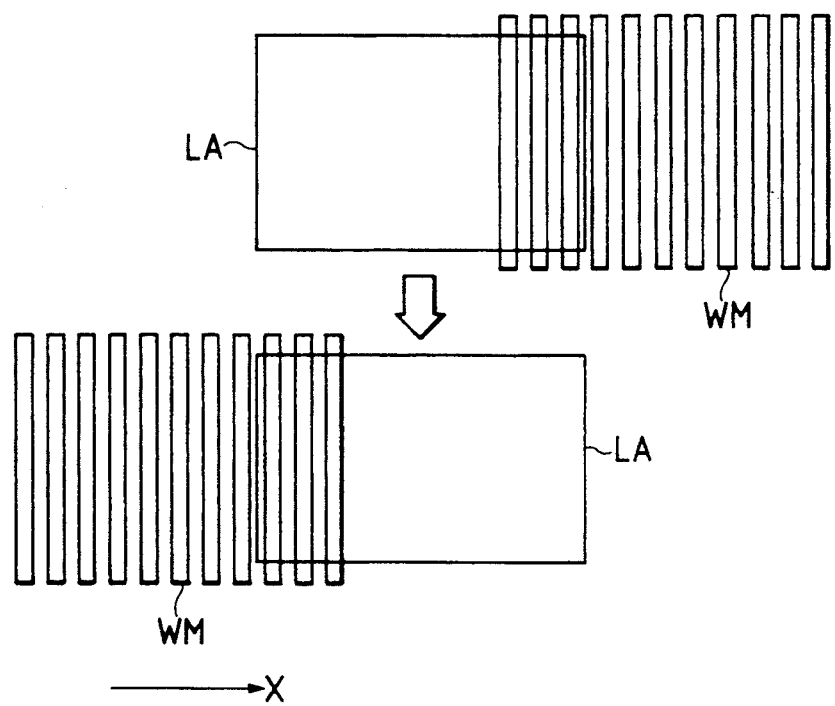
FIGS. 9A, 9B, 10A, 10B, 11A and 11B are views for explaining the function of a variation of said embodiment.
Figure 9B:
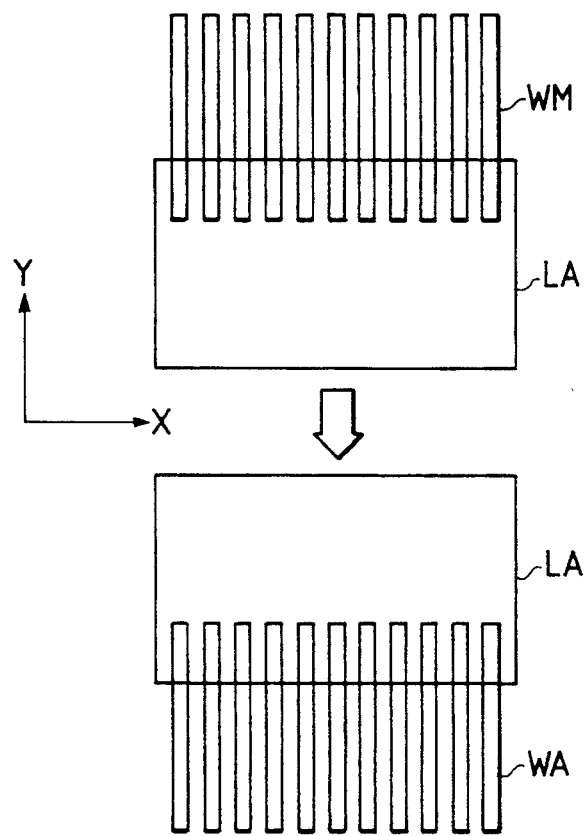

As explained in the foregoing, the present embodiment employs the diffraction grating marks 33a, 33b (FIGS. 3A and 3B) smaller than the dimensions (W, H) of the illumination area LA formed by the beams $LB_{1p}$, $LB_{2p}$, but a similar effect can be obtained by the use of marks equivalent in size to the wafer mark WM. With respect to the pitch P' of the interference fringes, at first a part of the wafer mark WM (for example three bar patterns at the left-hand end) is irradiated by the beams $LB_{1p}$, $LB_{2p}$ in the illumination area LA, as shown in FIG. 9A, and the optical beat signal of the interference light from the mark WM is detected. Subsequently the mark WM is so moved in the X-direction that another part thereof (for example three bar patterns at the right-hand end) is irradiated by said beams, and the optical beat signal is similarly detected. Thus the pitch P' of the interference fringes can be calculated by determining the relative phase difference of the optical beat signals in the two states, in a Similar manner to that explained before. On the other hand, the rotational error $\omega$ can be similarly calculated by moving the wafer mark WM in the Y-direction with respect to the beams $LB_{1p}$, $LB_{2p}$ (illumination area LA) and determining the relative phase difference of the optical beam signals in said two states, as shown in FIG. 9B.

As will be apparent from the equations (3) and (5), the precisions of measurement of the pitch P' and the rotational error $\omega$ become improved as the moving distances Lx (coefficient n) and Ly become longer. It is therefore possible to further improve the precision of measurement by employing a variable field diaphragm 25 shown in FIG. 1 in order to vary the size of the illumination area LA at the measurement and at the alignment operation, thereby expanding said area LA in the X-direction at the measurement of the pitch P' of the interference fringes and expanding said area LA in the Y-direction at the measurement of the rotational error $\omega$.

The expansion of the illumination area LA in the X- or Y-direction is effective not only in improving the precision of measurement in the present embodiment but also in correcting said pitch P' or the rotational error $\omega$ with the maximum intensity of the interference light in the conventional method. This is because an expansion of the illumination area LA (or aperture of the field diaphragm 25) reduces the diameter of the beams $LB_{1p}$, $LB_{2p}$ concentrated on the pupil plane Ep, whereby the beam diameter of the interference light BTL on the pupil plane Ep is also reduced to facilitate the separation of said interference light coming from the mark, on the photoelectric detector 31 even for a small pitch error or a small rotational error $\omega$. Thus the change in the contrast of the optical beat signal becomes more apparent, and such change is effective also in the conventional measuring method. If there is anticipated a large error in the pitch of the interference fringes or a large rotational error $\omega$, more efficient adjustment can be achieved by effecting a coarse adjustment with the conventional measuring method and then effecting a fine adjustment with the method of the above-explained embodiment.

In the present embodiment, parallel-faced flat glass plates are provided only in the path of the beam LB2 for regulating the crossing angle $\theta$ and the rotational error $\omega$, but such glass plates may also be provided in the path of the beam LB1. In such case, if the inclinations of said glass plates in the paths of the beams LB1, LB2 are made independently regulable, the glass plates 16a, 16b shown in FIG. 1 can be apparently dispensed with. Also the glass plates 12a, 12b may be positioned anywhere in the optical path from the laser unit 1 to the objective optical system 29, and the glass plates 16a, 16b may be positioned anywhere in the optical path from the laser unit 1 to the wafer W. Also at least are of the AOM5 and AOM6 is so positioned that the original point of deflection thereof is at a position conjugate with the pupil or in the vicinity thereof, and there is provided a driving circuit for regulating the frequency of the drive signals supplied to said AOM5 and AOM6. The fine adjustments of the crossing angle $\theta$ and the rotational error $\omega$ can be made with the AOM5, AOM6, even without the flat glass plates 12a, 12b, by regulation of the frequency of the drive signals according to said error $\omega$ etc. Particularly the crossing angle $\theta$ (or pitch P' of the interference fringes) can be regulated by rendering the focal length of the lens 24 variable and regulating said focal length. Also the rotational error $\omega$ may be regulated by rotation of an image rotator provided in the optical paths of the beams $LB_{1p}$, $LB_{2p}$. Also in the present embodiment, either of the crossing angle $\theta$ (pitch P' of the interference fringes) and the rotational error $\omega$ may be regulated at first.

Figure 10A:
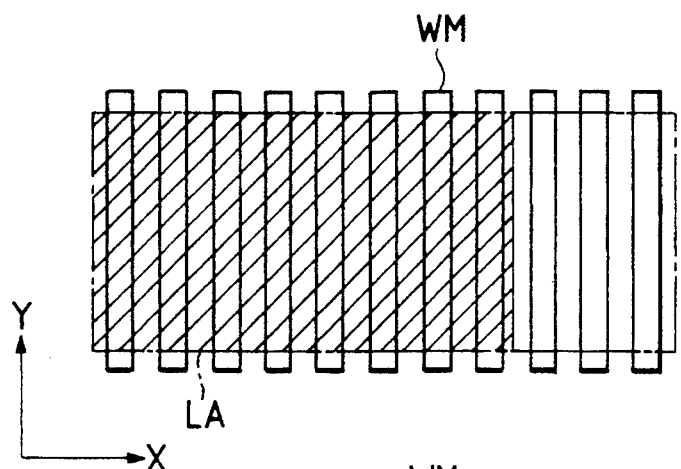
Figure 10B:
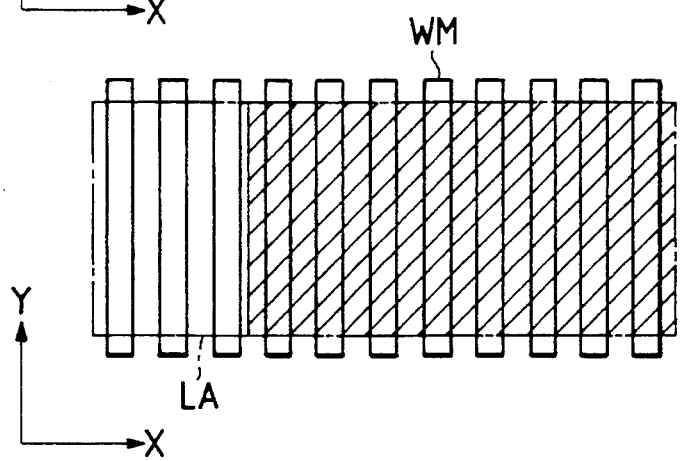
Figure 11A:
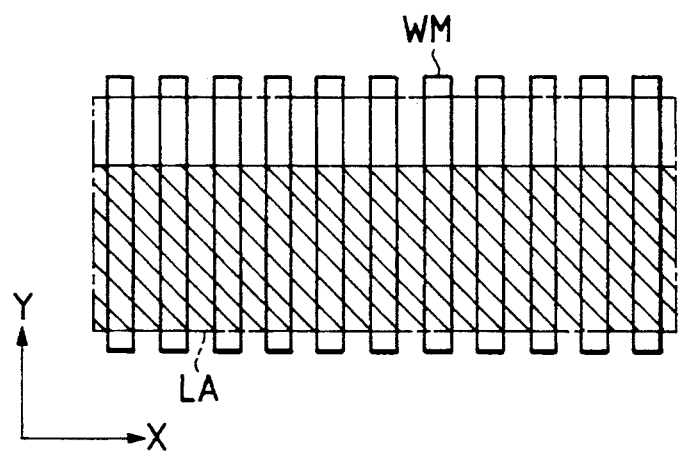
Figure 11B:
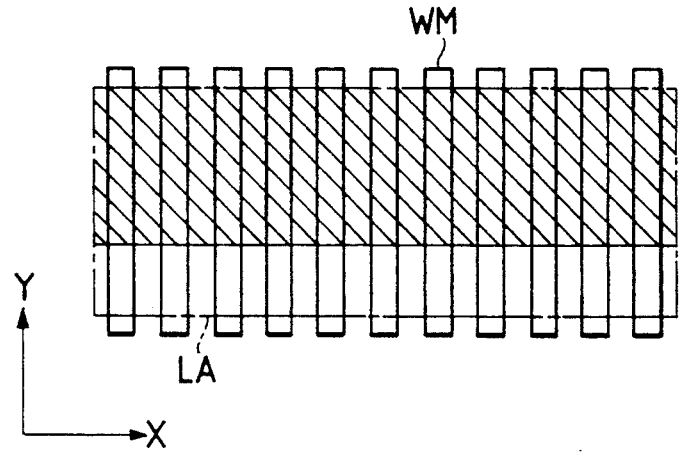

Furthermore, the use of a variable field diaphragm 25 for defining the shape and size of the illumination area LA of the beams $LB_{1p}$, $LB_{2p}$ can provide similar effects as in the above-explained embodiment, even without the movement of the grating marks 33a, 33b by the wafer stage WS at the measurement of said crossing angle $\theta$ or rotational error $\omega$. For example, for the measurement of the crossing angle $\theta$, the wafer mark WM standing still in the illumination area LA is shielded by the field diaphragm 25, except for a part at the right-hand end (three bar patterns corresponding to the embodiment explained above), as shown in FIG. 10A. Then the wafer mark WM is shielded by the diaphragm 25 except for a part at the left-hand end (similarly three bar patterns) as shown in FIG. 10B, and there can be calculated the crossing angle $\theta$ of the beams $LB_{1p}$, $LB_{2p}$, from the phase difference of the optical beat signals in these two states, detected in a similar manner as explained before. Also the rotational error $\omega$ can be calculated by shielding the wafer mark WM with the variable field diaphragm 25, as shown in FIGS. 11A and 11B. As the moving distance Lx or Ly in the above-explained embodiment, there may be employed the distance between the centers of gravity of the unshielded parts of the wafer mark WM in the illumination area LA. Also an improvement in the precision of measurement by multi-point measurements can be expected as in the above-mentioned embodiment, by shifting the mark area shielded by the field diaphragm 25 in succession by a predetermined amount in the X- or Y-direction. The varying mechanism for the field diaphragm 25 may be composed, for example, of a mechanism for driving four shield plates, a liquid crystal device or an electrochromic device, or a mechanism for rotating a turret plate having plural apertures different in shape and/or size.

Figure 12:
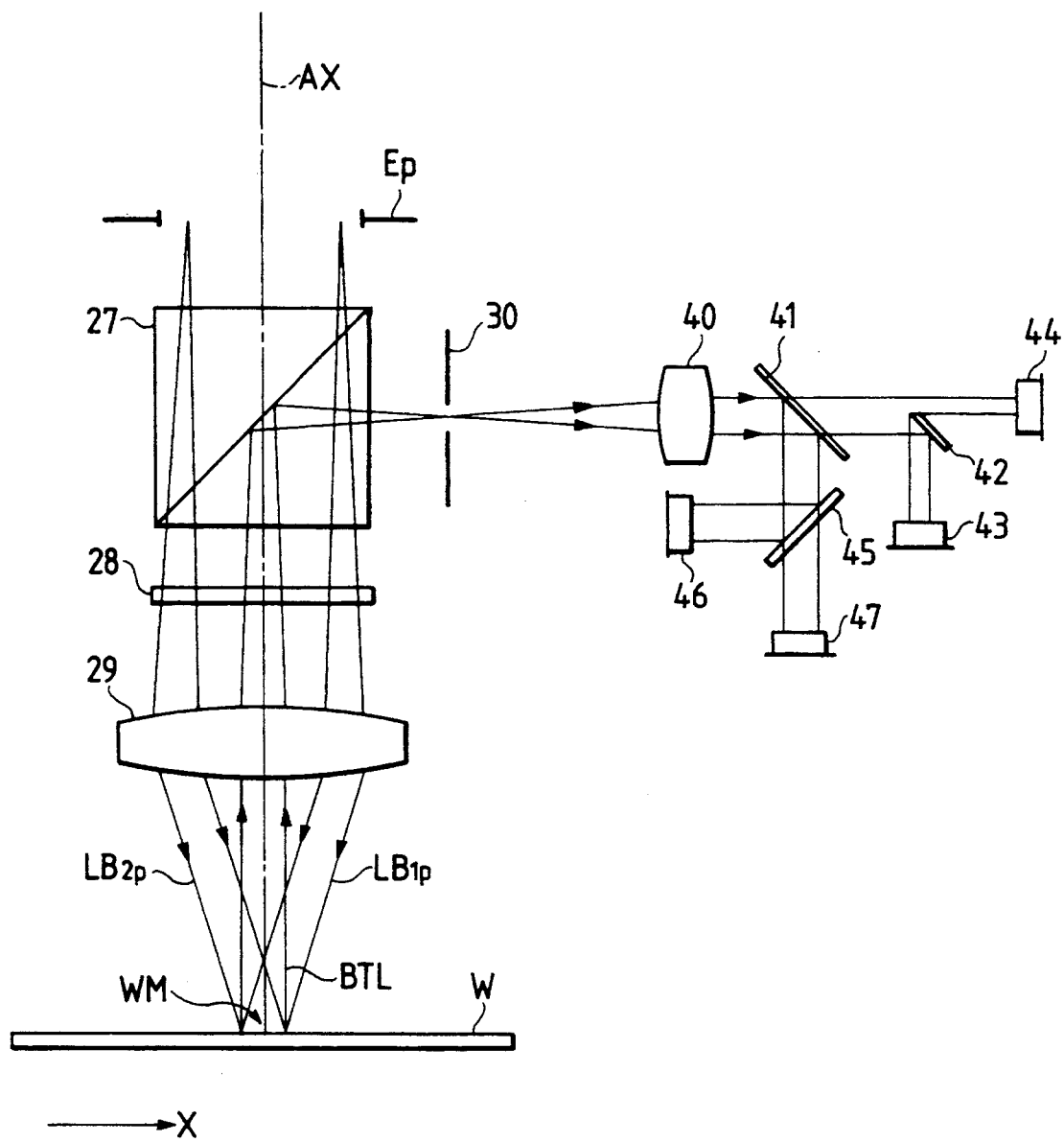
FIG. 12 is a view showing a variation of the light-receiving system of said embodiment.

Also the light receiving system of the alignment system may be composed as shown in FIG. 12 to achieve similar effects as those of the variable field diaphragm 25. Referring to FIG. 12, the interference light BTL from the wafer mark WM is transmitted by a spatial filter 30 and a lens 40, and is split in amplitude by a half mirror 41. The split interference light BTL is further split by splitters 42, 45 positioned in planes conjugate with the wafer, and is are received by photoelectric detectors 43, 44 and 46, 47. The splitter 42 is so positioned as to split the image of the mark in the X-direction (direction of measurement), and is used for measuring the pitch P' of the interference fringes formed by the beams $LB_{1p}$, $LB_{2p}$. On the other hand, the splitter 45 is so positioned as to split said image in the Y-direction (non-measuring direction), and is used for measuring the rotational error $\omega$ of the beams $LB_{1p}$, $LB_{2p}$. Such structure does not require driving the reference member 33 (diffraction grating marks) or the field diaphragm 25 at the measurement, and can reduce the time required for adjustment since it can simultaneously detect two optical beat signals.

It is also possible to dispense with the half mirror 41 and to position a splitter at the focal position (wafer conjugate plane) of the lens 40 with switchable splitting direction of the interference light BTL, thereby using, the photoelectric detectors in common. A variable field diaphragm may be employed as said splitter, thereby achieving the switching of splitting direction of the interference light BTL in simple manner and the common use of the photoelectric detectors. Also in the alignment operation after the adjustments explained above, the phase signal obtained from either of the photoelectric detectors 43, 44 (or 46, 47) or the sum of phase signals from both of said detectors may be used as the optical beat signal SD mentioned above.

The foregoing embodiment has been limited to an aligning device suitable for an off-axis alignment system, but the present invention is likewise applicable to other alignment systems such as a TTR alignment system for direct alignment of a reticle and a wafer employing a grating mark of the reticle (or mask) and that of the wafer, of a mask-wafer alignment system of proximity exposure type.

FIGS. 13, 13A and 13B are schematic perspective view of a stepper provided with a TTR alignment system, wherein the basic structure is the same as that of the foregoing embodiment shown in FIG. 1, though, in the TTR system, the beams irradiating the wafer mark WM or reticle mark RM from two directions are polarized in mutually complementary states (for example linearly polarized in mutually orthogonal directions or circularly polarized in mutually opposite directions), and the light receiving system is constructed differently.

Referring to FIGS. 13, 13A and 13B an objective lens OBJ, including a bifocal element consisting of a plano-convex lens of a double refractive material and a plano-concave glass lens mutually adhered by the convex and concave faces thereof, projects P-polarized beams, out of two beams BM1, BM2 of a frequency difference $\Delta f$, onto a reticle mark RM, and also projects S-polarized beams onto a wafer mark WM through a window RS on the reticle R and a projection lens PL (with entrance pupil Ep'). Above the reticle R there is provided a dichroic mirror DCM for separating the wavelength of the exposure light and of two beams BM1, BM2. The circuit pattern area of the reticle R is surrounded by an opaque zone of a predetermined width, in which a transparent window RS is formed, and a one-dimensional grating mark (reticle mark) RM is formed in about a half of said window RS. On the other hand, on the wafer W, a wafer mark WM is formed in a corresponding position in a street line (with a width of 50–100 $\mu$m) around each short area SA.

Figure 14:
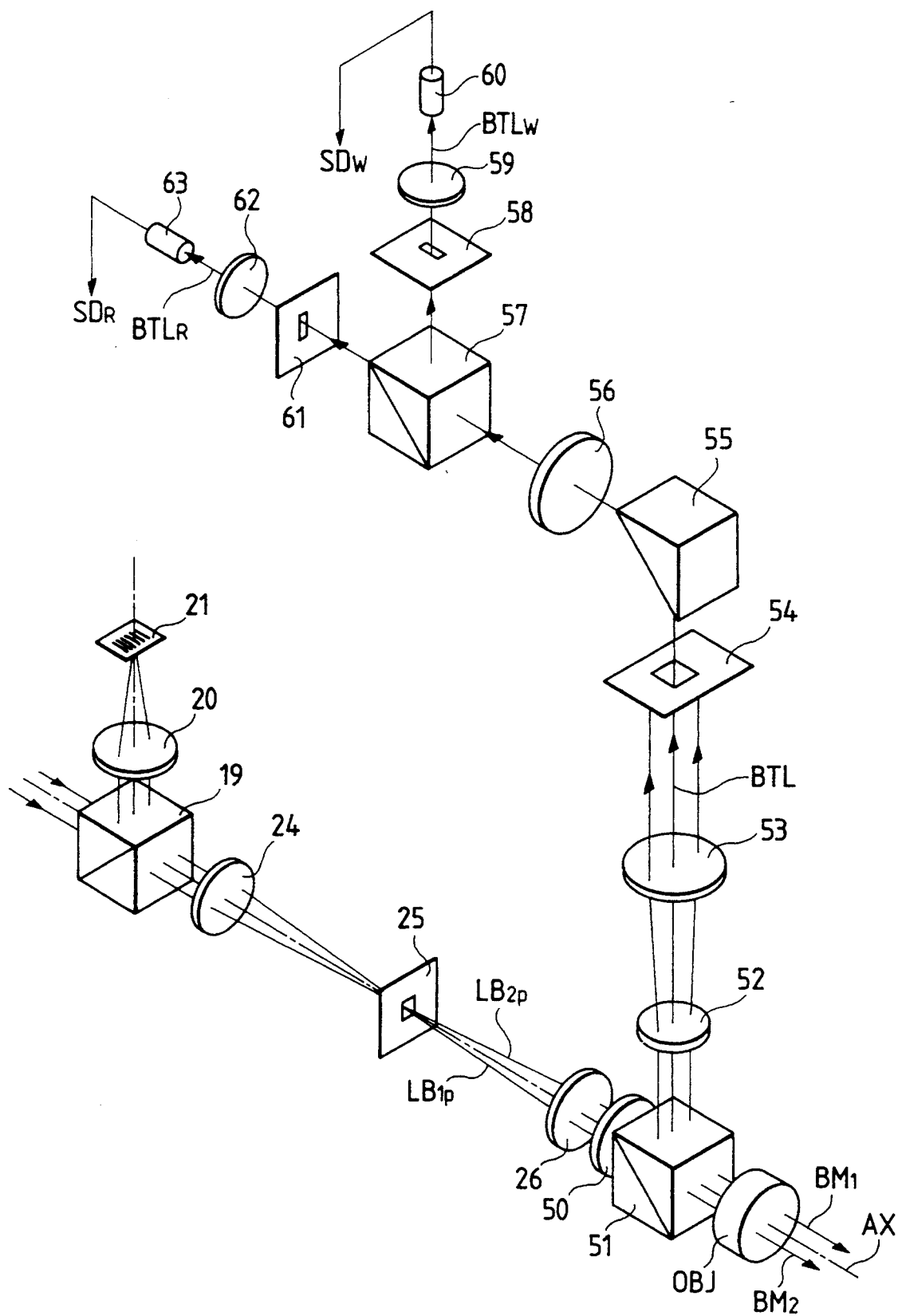
FIG. 14 is a perspective view showing detailed structure of a light-receiving system of the alignment system of TTR method shown in FIG. 13.

FIG. 14 is a detailed perspective view of the light receiving system of the TTR alignment system, wherein components the same as or equivalent to those in FIG. 1 are represented by the same symbols. Referring to FIG. 14, two P-polarized beams $LB_{1p}$, $LB_{2p}$ are converted by a $\frac{1}{2}$ wavelength plate 50 into beams BM1, BM2 each including P- and S-polarized components and mutually having a frequency difference $\Delta f$. Said beams enter the objective lens OBJ through a beam splitter 51. As shown in FIG. 14, the light reflected by the reticle mark RM or the wafer mark WM returns through the objective lens OBJ, then is reflected by the beam splitter 51, is transmitted by an afocal enlarging relay system 52, 53 and reaches a spatial filter 54. Among said reflected light, the 0-th order light returns coaxially with the principal rays of the beams BM1, BM2, while the principal rays of the ±1st-order 15 diffracted (interference) lights BTL return coaxially with the optical axis AX of the alignment system. The spatial filter 54 is so positioned substantially conjugately with the entrance pupil Ep' of the projection lens PL, as to intercept the 0-th order light but to extract the interference light BTL. At the position of said spatial filter 54, there coaxially exists the interference light BTL from the reticle mark RM and from the wafer mark WM, in mutually complementary polarized states. For the purpose of clarification, the interference light from the reticle mark RM will hereinafter be represented as $BTL_R$, while that from the wafer mark WM will be represented as $BTL_W$.

The interference light $BTL_R$, $BTL_W$ extracted by the spatial filter 54 is reflected by a mirror 55, then transmitted by an imaging (inverse Fourrier conversion) lens 56, and reach a polarizing beam splitter 57, where the S-polarized interference light $BTL_W$ is reflected and received by a photoelectric detector 60 through a field diaphragm 58 positioned on a plane conjugate with the image and a condenser lens 59. On the other hand, the P-polarized interference light $BTL_R$, transmitted by the polarizing beam splitter 57, reaches a photoelectric detector 63 through a field diaphragm 61 positioned on a plane conjugate with the image and a condenser lens 62. The field diaphragm 58 has an aperture matching the size and position of the wafer mark WM, while the field diaphragm 61 has an aperture matching the size and position of the reticle mark RM. The photoelectric detector 60 generates an optical beat signal $SD_W$ of a frequency corresponding to the frequency difference $\Delta f$, while the photoelectric detector 63 generates an optical beat signal $SD_R$ of a frequency corresponding to the frequency difference $\Delta f$. The phase detecting system 32 determines the phase difference of said two signals $SD_W$, $SD_R$, and the main controller MCS causes a relative movement of the reticle R and the wafer W 1 so as to bring said phase difference to substantially zero, thereby exactly aligning the projected image of the reticle pattern with the shot area SA.

In the apparatus of the above-explained structure, if the reticle R is exactly fixed on the stepper, the rotational error $\omega_R$ of two P-polarized beams $BM_{1p}$, $BM_{2p}$ with respect to the measuring direction of the reticle mark RM is approximately equal to the rotational error $\omega_W$ of two S-polarized beams $BM_{1s}$, $BM_{2s}$ with respect to the measuring direction of the wafer mark WM. Consequently, if the correction is made on either of said rotational errors, for example on $\omega_R$, as in the foregoing embodiment, the rotational error $\omega_R$ of the reticle side is simultaneously made substantially zero. On the other hand, with respect to the crossing angle $\theta_R$ of the beams $BM_{1p}$, $BM_{2p}$ and the crossing angle $\theta_W$ of the beams $BM_{1s}$, $BM_{2s}$ (namely the pitches $P_R'$, $P_W'$ of the interference fringes), since the projection lens PL is corrected for aberrations at the exposure wavelength (for example that of g-line, i-line or KrF excimer laser), a color aberration is generated in the TTR alignment system (FIG. 13) employing for example a He-Ne laser as the light source, so that the crossing angle $\theta_W$ of the beams $BM_{1s}$, $BM_{2s}$ is not necessarily set exactly even if the crossing angle $\theta_R$ of the beams $BM_{1p}$, $BM_{2p}$ is regulated. In the TTR system, therefore, the same effects as in the foregoing embodiment can be obtained by measuring the pitches $P_R'$, $P_W'$ of the interference fringes at the reticle R and the wafer W in a similar manner as in the foregoing embodiment, and regulating the distance of the spots of the beams $LB_{1p}$, $LB_{2p}$ on the pupil plane of the alignment system for example by means of the average of thus measured values, thereby correcting the crossing angles $\theta_R$, $\theta_W$.

Also at the regulation of the crossing angle $\theta_R$ of the beams $BM_{1p}$, $BM_{2p}$ and the crossing angle $\theta_W$ of the beams $BM_{1s}$, $BM_{2s}$, there may be employed a method of only measuring the pitch $P_W'$ of the interference fringes by means of the reference member 33 on the wafer stage WS and regulating the crossing angle $\theta_W$ of the beams $BM_{1s}$, $BM_{2s}$ according to thus measured pitch. This method does not necessarily provide exact setting of the crossing angle $\theta_R$ of the beams $BM_{1p}$, $BM_{2p}$, but can be considered enough because the reticle mark RM is almost free from partial optical disorder of the grating mark, such as partial fluctuation in the intensity of the diffracted light from the mark, so that the detecting precision of the reticle side scarcely deteriorates. Also if the reticle R contains a remaining alignment error, the same situation arises on the rotational errors $\omega_R$, $\omega_L$ as in the crossing angles $\theta_R$, $\theta_W$, so that the above-explained averaging process is desirable in the correction of said rotational errors. Also two beams $BM_{1p}$, $BM_{2p}$ irradiating the reticle mark RM and the wafer mark WM may be both polarized in the same manner (P- or S-polarized), and, in such case, the interference light generated from both grating marks is separated on a plane, conjugate with the image, in the light receiving system and photoelectrically detected therein. Also in the TTR system, it is desirable to render the field diaphragm 61 variable, thereby making switchable the splitting direction of the interference light $BTL_R$ from the mark RM, in order to prevent a decrease in the throughput, since otherwise the interference light $BTL_W$ from the wafer mark WM is intercepted by the opaque zone of the reticle R at the movement thereof in the measurement of the crossing angle $\theta_R$ of the beams $BM_{1p}$, $BM_{2p}$ and the rotational error $\omega_R$ SO that simultaneous measurement of both marks becomes difficult. This is also for preventing the increase in the mark area, resulting from the presence of a new grating mark on the reticle R.

Figure 15:
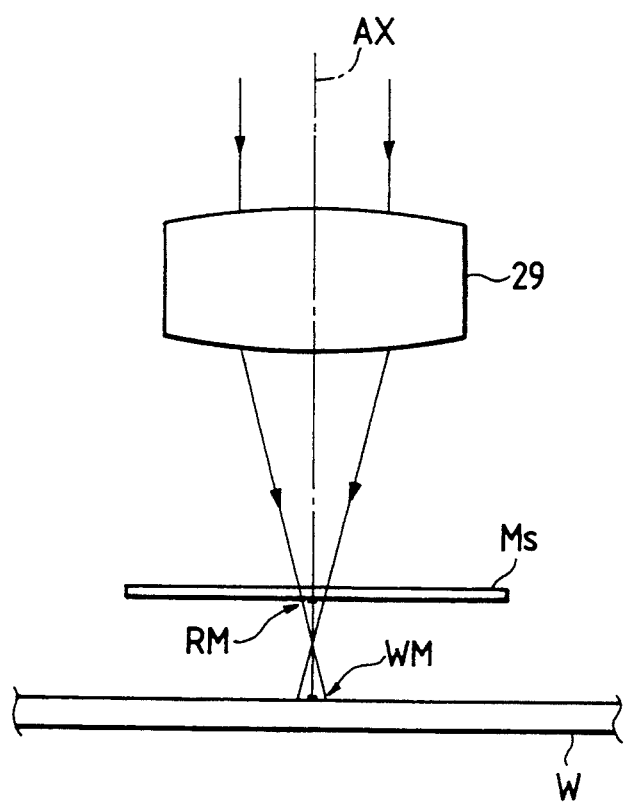
FIG. 15 is a schematic view of the alignment system of the present invention applied to a proximity exposure apparatus.

The alignment system of the present invention, when applied to a proximity exposure apparatus, is different, as shown in FIG. 15, in that the principal rays of the beams $LB_{1p}$, $LB_{2p}$ emerging from the objective lens 29 are so positioned as to mutually cross at the approximate center of a proximity gap between a mask Ms and a wafer W. Said proximity gap is generally selected within a range of 10–500 μm, depending on the light source and the projection system for the exposure light. The grating mark RM of the mask Ms and the grating mark WM of the wafer W are securely present, in case of a narrow gap, within the axial crossing area of the beams $LB_{1p}$, $LB_{2p}$, but, in case of a wider gap, it is important whether said marks RM, WM are present in said crossing area. However, this concern is easily solved by simply enlarging the diameters of the beams $LB_{1p}$, $LB_{2p}$ reaching the mask Ms, so that the axial length of the crossing area can be relatively freely selected. This problem can also be solved by the use of the bifocal optical system (objective lens OBJ) shown in FIG. 13, and the images of the grating marks RM, WM can be focused on a same plane regardless of the depth of focus of the objective lens 29.

Therefore, also in the exposure apparatus of proximity type, the positional relationship of the marks RM and WM is selected the same as that in the TTR system shown in FIG. 13, and the same pitch of grating is selected for both marks. The crossing angle $\theta$ and the rotational error $\omega$ of the beams $LB_{1p}$, $LB_{2p}$ can be regulated, in the same manner as in the TTR system explained above, by separating and photoelectrically detecting the interference light generated from both grating marks and utilizing the relative phase difference of two optical beat signals thus obtained.

Furthermore, the present invention is effective not only to the alignment system of heterodyne type but also that of homodyne type. In the homodyne system, the interference fringes do not flow on the grating mark. Therefore, a relative movement is caused between said stationary interference fringes and the grating mark in the direction of arrangement of grating, and the photoelectric signal corresponding to the intensity of the interference light generated from the grating mark is sampled in synchronization with an up-down pulse signal generated by the laser interferometer at every unit movement (0.01 μm) of the wafer stage and the sampled values are converted into digital values and stored in succession in a memory. Thus the rotational error ω of two beams can be corrected by determining the relative phase difference of the sinusoidal photoelectric signals at two positions, in a similar manner as in the heterodyne system explained before. On the other hand, the pitch P' of the interference fringes (or crossing angle θ) of two beams can be calculated in a simpler manner, after a single relative movement of the fringes of two beams and the grating mark, by determining the difference between the wavelength of said sinusoidal photoelectric signals and the design value, or by determining the number and distance of peak values present between two arbitrary peak values on the wave form of the photoelectric signal. In the measurement of the crossing angle of two beams in the homodyne system, the wafer mark WM as shown in FIG. 9A cannot be used. It is desirable to use a grating mark having a length in the measuring direction (direction of arrangement of grating) shorter than the dimension W of the illumination area LA, for example the grating mark 33a.

Also in a method not forming interference fringes on the wafer mark WM by employing two differently polarized beams, and effecting photoelectric detection after causing interference by a polarizer between P- and S-polarized beams returning from the mark along the optical axis AX, the present invention is naturally effective in the measurement and adjustment of the crossing angle and the rotational error of said two beams.

As explained in the foregoing, the present invention determines the crossing angle of two beams irradiating a diffraction grating formed on a substrate from two different direction, and the rotational error of the crossing line between a plane containing said two beams and the surface of the substrate, with respect to the direction of arrangement of said diffraction grating, based on the phase difference information of photoelectric signals corresponding to the intensities of the diffracted light generated from said grating. Consequently, even if the intensity of the diffracted light (namely the voltage of said photoelectric signal) fluctuates for example due to electric noise, the precision of measurement of said crossing angle or rotational error does not deteriorated, so that an improved accuracy of adjustment can be realized. Also a further improved precision can be provided by a higher precision in the positioning of stage and the positional measurement thereof, and by multiple measurements. Furthermore, more precise measurement and adjustment of the crossing angle or the rotational error can be achieved by enlarging the illumination area of two beams (area of formation of interference fringes) relative to the diffraction grating.

What is claimed is:

1. An aligning device comprising:
   a movable stage for holding a substrate;
   a reference grating plate provided on said stage;
   irradiation means for supplying two beams for irradiating said reference grating plate with a crossing angle, a predetermined frequency difference existing between frequencies of said two beams, said irradiation means having a shielding member for partially shielding selectively a crossing area where said two beams cross each other on aid reference grating plate;
   a photoelectric detector for receiving interference light generated by light diffracted in substantially the same direction from said crossing area on said reference grating plate and generating detection signals; and
   measuring means for measuring at least one of said crossing angle of said two beams and a rotational error of a crossing line between said reference grating plate and a plane containing principal rays of said two beams with respect to a direction of grating arrangement of said reference grating plate, on the basis of a phase difference of first and second detection signals, said first detection signal being generated by said photoelectric detector when a first area within said crossing area is shielded by said shielding member, and said second detection signal being generated by said photoelectric detector when a second area within said crossing area is shielded by said shielding member, said first and second areas having at least portions thereof that differ from each other.

2. An aligning device according to claim 1, wherein said irradiation means includes an objective optical system, said two beams pass through a pupil plane of said objective optical system or a plane adjacent to the pupil plane, with a predetermined distance therebetween, and said shielding member is a variable field diaphragm disposed in a plane conjugate with said reference grating plate with respect to said object optical system.

3. An aligning device comprising:
   a movable stage for holding a substrate;
   a reference grating plate provided on said stage;
   irradiation means for supplying two beams for irradiating said reference grating plate with a crossing angle, a predetermined frequency difference existing between frequencies of said two beams;
   a photoelectric detector for receiving interference light generated by light diffracted in substantially the same direction from a crossing area where said two beams cross each other on said reference grating plate and generating detection signals; and
   measuring means for measuring at least one of said crossing angle of said two beams and a rotational error of a crossing line between said reference grating plate and a plane containing principal rays of said two beams with respect to a direction of grating arrangement of said reference grating plate, on the basis of a phase difference of first and second detection signals, said first detection signal being generated by said photoelectric detector when said reference grating plate is positioned at a first area within said crossing area by said stage, and said second detection signal being generated by said photoelectric detector when said reference grating plate is positioned at a second area with said crossing area by said stage, said first and second areas having at least portions thereof that differ from each other.

4. An aligning device according to claim 3, wherein said measuring means includes coordinates measuring means for measuring the coordinates of a position of said stage with respect to a predetermined rest frame when said reference grating plate is positioned at said first and second areas, respectively, and a calculation circuit for calculating said rotational error of said crossing line on the basis of the measured coordinates of the position and said phase difference.

5. An aligning device comprising:
a movable stage for holding a substrate;
a reference grating plate provided on said stage;
irradiation means for supplying two beams for irradiating said reference grating plate with a crossing angle, a predetermined frequency difference existing between frequencies of said two beams;
a photoelectric detector for receiving interference light generated by light diffracted in substantially the same direction from a crossing area where said two beams cross each other on said reference grating plate and generating detection signals;
means for supplying alternately interference light corresponding to a first area within said crossing area and interference light corresponding to a second area within said crossing area to said photoelectric detector, said first and second areas having at least portions thereof that differ from each other; and
measuring means for measuring at least one of said crossing angle of said two beams and a rotational error of a crossing line between said reference grating plate and a plane containing principal rays of said two beams with respect to a direction of grating arrangement of said reference grating plate, on the basis of a phase difference of two detection signals generated by said photoelectric detector.

6. An aligning device comprising:
a movable stage for holding a substrate;
a reference grating plate provided on said stage;
irradiation means for supplying two beams for irradiating said reference grating plate with a crossing angle, a predetermined frequency difference existing between frequencies of said two beams;
a photoelectric detector for receiving interference light generated by light diffracted in substantially the same direction from a crossing area where said two beams cross each other on said reference grating plate and generating detection signals, said photoelectric detector having first and second light receiving elements;
means for supplying interference light corresponding to a first area within said crossing area to said first light receiving element and supplying interference light corresponding to a second area within said crossing area to said second light receiving element, said first and second areas having at least portions thereof that differ from each other; and
measuring means for measuring at least one of said crossing angle of said two beams and a rotational error of a crossing line between said reference grating plate and a plane containing principal rays of said two beams with respect to a direction of grating arrangement of said reference grating plate, on the basis of a phase difference of two detection signals generated by said photoelectric detector.

7. An aligning device comprising:
irradiation means for supplying two beams for irradiating said reference grating plate with a crossing angle, a predetermined frequency difference existing between frequencies of said two beams;
a photoelectric detector for receiving interference light generated by light diffracted in substantially the same direction from a crossing area where said two beams are crossing on said reference grating plate and generating detection signals;
moving means for moving said crossing area and said reference grating plate relative to each other so that said two beams can be supplied for irradiating successively each of a plurality of partial areas on said reference grating plate; and
measuring means for measuring at least one of said crossing angle of said two beams and a rotational error of a crossing line between said reference grating plate and a plane containing principal rays of said two beams with respect to a direction of grating arrangement of said reference grating plate, on the basis of a phase difference of a plurality of detection signals generated by said photoelectric detector in accordance with interference light from each of said plurality of partial areas.

8. An aligning device according to claim 7, wherein said moving means has a shielding member for partially shielding said crossing area selectively and controlling means for controlling said shielding member so that said two beams can be supplied for irradiating successively each of said plurality of partial areas.

9. An aligning device according to claim 7, wherein said moving means includes a movable stage for holding said reference grating plate and controlling means for controlling movement of said stage so that said two beams can be supplied for irradiating successively each of said plurality of partial areas.

10. An aligning device according to claim 7, wherein said irradiation means includes an objective optical system, and said two beams pass through a pupil plane of said objective optical system or a plane adjacent to the pupil plane, with a predetermined distance therebetween; and further comprising:
means for changing at least one position of said two beams within the pupil plane of said objective optical system or said plane adjacent to the pupil plane in accordance with at least one of said rotational error and said crossing angle.

11. An aligning device comprising:
irradiation means for supplying two beams for irradiating said reference grating plate with a crossing angle, a predetermined frequency difference existing between frequencies of said two beams;
a photoelectric detector for receiving interference light beams generated by light diffracted in substantially the same direction from a crossing area where said two beams are crossing each other on said reference grating plate and generating detection signals;
incident means for supplying a plurality of interference light beams corresponding, respectively, to a plurality of partial areas within said crossing area, to said photoelectric detector; and
measuring means for measuring at least one of said crossing angle of said two beams and a rotational error of a crossing line between said reference grating plate and a plane containing principal rays of said two beams with respect to a direction of grating arrangement of said reference grating plate, on the basis of a phase difference of a plurality of detection signals generated by said photoelectric detector in accordance with said plurality of interference light beams.

12. An aligning device according to claim 11, wherein said incident means includes an objective optical system for introducing said interference light beams into said photoelectric detector and an extracting member disposed in a plane substantially conjugate with said reference grating plate with respect to said objective optical system, said extracting member extracting each of said plurality of interference light beams from among interference light beams from said crossing area.

13. An aligning device according to claim 12, wherein said extracting member is a light dividing device for dividing interference light from said crossing area in accordance with said plurality of partial areas into a plurality of interference light beams and said photoelectric detector has a plurality of light receiving elements respectively corresponding to the plurality of divided interference light beams.

14. An aligning device according to claim 12, wherein said extracting member is a shielding member for partially shielding selectively interference light from said crossing area in accordance with said plurality of partial areas.

15. An aligning device according to claim 11, wherein said irradiation means includes an objective optical system, and said two beams pass through a pupil plane of said objective optical system or a plane adjacent to the pupil plane, with a predetermined distance therebetween; and further comprising:
means for changing at least one position of said two beams within the pupil plane of said objective optical system or said plane adjacent to the pupil plane in accordance with at least one of said rotational error and said crossing angle.

16. A method of calibrating an aligning device comprising the steps of:
radiating two beams having a predetermined frequency difference to a reference grating plate with a crossing angle;
moving said reference grating plate relative to a crossing area where said two beams cross each other on said reference grating plate, so that said two beams successively irradiate each of a plurality of partial areas on said reference grating plate and generate diffracted interference light in substantially the same direction from each of aid plurality of partial areas;
photoelectrically detecting said interference light and generating detection signals; and
measuring at least one of said crossing angle of said two beams and a rotational error of a crossing line between said reference grating plate and a plane containing principal rays of said two beams with respect to a direction of grating arrangement of said reference grating plate, on the basis of a phase difference of a plurality of said detection signals.

17. A method according to claim 16, wherein said radiating includes passing said two beams through a pupil plane of an objective optical system or a plane adjacent to the pupil plane with a predetermined distance therebetween, and further comprising the step of:
changing at least one position of said two beams within said pupil plane or said plane adjacent to the pupil plane in accordance with at least one of the measured rotational error and the measured crossing angle.

18. A method of calibrating an aligning device comprising the steps of:
radiating two beams having a predetermined frequency difference to a reference grating plate with a crossing angle so as to generate diffracted interference light in substantially the same direction from each of a plurality of partial areas within a crossing area where said two beams cross each other on said reference grating plate;
photoelectrically detecting said interference light and generating detection signals; and
measuring at least one of said crossing angle of said two beams and a rotational error of a crossing line between said reference grating plate and a plane containing principal rays of said two beams with respect to a direction of grating arrangement of said reference grating plate, on the basis of a phase difference of a plurality of said detection signals.

19. A method according to claim 18, wherein said radiating includes passing said two beams through a pupil plane of an objective optical system or a plane adjacent to the pupil plane with a predetermined distance therebetween, and further comprising the step of:
changing at least one position of said two beams within said pupil plane or said plane adjacent to the pupil plane in accordance with at least one of the measured rotational error and the measured crossing angle.

* * * * *